US009939505B2

(12) United States Patent
Yui

(10) Patent No.: US 9,939,505 B2
(45) Date of Patent: Apr. 10, 2018

(54) MAGNETIC RESONANCE IMAGING APPARATUS AND MAGNETIC RESONANCE IMAGING METHOD

(71) Applicant: TOSHIBA MEDICAL SYSTEMS CORPORATION, Otawara-shi, Tochigi (JP)

(72) Inventor: Masao Yui, Otawara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1132 days.

(21) Appl. No.: 14/147,613

(22) Filed: Jan. 6, 2014

(65) Prior Publication Data
US 2014/0117987 A1 May 1, 2014

Related U.S. Application Data

(63) Continuation of application No. PCT/JP2012/073722, filed on Sep. 14, 2012.

(30) Foreign Application Priority Data

Oct. 13, 2011 (JP) ................................. 2011-225458

(51) Int. Cl.
*G01R 33/54* (2006.01)
*G01R 33/56* (2006.01)
(Continued)

(52) U.S. Cl.
CPC ............. *G01R 33/54* (2013.01); *G01R 33/28* (2013.01); *G01R 33/5605* (2013.01);
(Continued)

(58) Field of Classification Search
CPC ...... G01R 33/28; G01R 33/54; G01R 33/246; G01R 33/288; G01R 33/5605;
(Continued)

(56) References Cited

U.S. PATENT DOCUMENTS 5,838,156 A * 11/1998 Miyabayashi ..... G01R 33/4625
324/307
6,043,651 A * 3/2000 Heid ................ G01R 33/56554
324/218

(Continued)

FOREIGN PATENT DOCUMENTS

JP 2004-089275 3/2004

OTHER PUBLICATIONS

JP Office Action dated Aug. 4, 2015 in in JP 2011-225458.
(Continued)

*Primary Examiner* — Dixomara Vargas
(74) *Attorney, Agent, or Firm* — Nixon & Vanderhye P.C.

(57) ABSTRACT

According to one embodiment, a magnetic resonance imaging apparatus includes a data acquiring unit and a data processing unit. The data acquiring unit is configured to acquire magnetic resonance signals according to an imaging condition for applying a first off-resonance radio frequency pulse after an application of an excitation pulse and before a readout of the magnetic resonance signals, and applying a second off-resonance radio frequency pulse after the readout of the magnetic resonance signals and before an application of a following excitation pulse. The first off-resonance radio frequency pulse generates a phase shift in the magnetic resonance signals. The second off-resonance radio frequency pulse compensates the phase shift. The data processing unit is configured to obtain information to be obtained by data processing of the magnetic resonance signals.

19 Claims, 9 Drawing Sheets

(51) Int. Cl.
  *G01R 33/561* (2006.01)
  *G01R 33/24* (2006.01)
  *G01R 33/28* (2006.01)
  *G01R 33/567* (2006.01)
(52) U.S. Cl.
  CPC ..... *G01R 33/5614* (2013.01); *G01R 33/5617* (2013.01); *G01R 33/5618* (2013.01); *G01R 33/246* (2013.01); *G01R 33/288* (2013.01); *G01R 33/5673* (2013.01)
(58) Field of Classification Search
  CPC ............ G01R 33/5614; G01R 33/5617; G01R 33/5618; G01R 33/5673
  See application file for complete search history.

(56) References Cited

U.S. PATENT DOCUMENTS

| | | | | |
|---|---|---|---|---|
| 6,188,219 | B1 * | 2/2001 | Reeder | G01R 33/58 324/307 |
| 7,233,818 | B1 * | 6/2007 | Aletras | G01R 33/56308 324/307 |
| 7,619,411 | B2 * | 11/2009 | Reeder | G01R 33/4824 324/309 |
| 7,706,857 | B2 * | 4/2010 | Aletras | G01R 33/56308 324/306 |
| 8,228,063 | B2 * | 7/2012 | Kimura | A61B 5/055 324/307 |
| 8,229,544 | B2 * | 7/2012 | Tseng | G01R 33/4804 324/315 |
| 8,664,954 | B2 * | 3/2014 | Hetzer | G01R 33/4818 324/309 |
| 9,519,040 | B2 * | 12/2016 | Ma | G01R 33/5602 |
| 2010/0315084 | A1 | 12/2010 | Sacolick et al. | |

OTHER PUBLICATIONS

Office Action dated Feb. 1, 2016 in CN Patent Application No. 201280001291.5.
Office Action dated Oct. 17, 2014 in CN Patent Application No. 201280001291.5.
Notification of Transmittal of Translation of the International Preliminary Report on Patentability in PCT/JP2012/073722, dated Apr. 24, 2014.
V. Sturm et al., "Simultaneous Bloch Siegert B1+ and T2 mapping in one experiment using a multi spin echo sequence", *Proc. Int'l. Soc. Mag. Reson. Med.* 19, 2011, 05, 1 pg.
T. C. Basse-Lusebrink et al., "Turbo Spin Echo Bloch Siegert Shift B1+ Mapping", *Proc. Intl. Soc. Mag. Reson. Med.* 19, 2011, 05, 1pg.
Sacolick et al., "B1 mapping by Bloch-Siegert", *Magn. Reson. Med.*, 2010.05, vol. 63, No. 5, pp. 1315-1322.
International Search Report for PCT/JP2012/073722, dated Dec. 4, 2012.
Written Opinion for PCT/JP2012/073722, dated Dec. 4, 2012.
Office Action dated Aug. 6, 2015 in CN Patent Application No. 201280001291.5.

* cited by examiner (A)

(B)

(C)

(D)

MAGNETIC RESONANCE IMAGING APPARATUS AND MAGNETIC RESONANCE IMAGING METHOD

CROSS REFERENCES TO RELATED APPLICATIONS

This is a continuation of Application PCT/JP2012/73722, filed Sep. 14, 2012.

This application is based upon and claims the benefit of priority from Japanese Patent Application No. 2011-225458, filed Oct. 13, 2011; the entire contents of which are incorporated herein by reference.

FIELD

Embodiments described herein relate generally to a magnetic resonance imaging (MRI) apparatus and a magnetic resonance imaging method.

BACKGROUND

MRI is an imaging method which magnetically excites nuclear spin of an object set in a static magnetic field with an RF (radio frequency) signal having the Larmor frequency and reconstructs an image based on MR (magnetic resonance) signals generated due to the excitation. That is, in an MRI apparatus, an RF pulse having the resonant frequency proportional to an intensity of the static magnetic field is applied to an object in order to generate the nuclear magnetic resonance phenomenon.

In an MRI apparatus, an excitation for slice selection is often performed in order to select a slice in which MR signals generate. The excitation for slice selection is carried out by applying a gradient magnetic field for SS (slice selection). When an SS gradient magnetic field is applied, the resonant frequency of MR signals actually differs from the resonant frequency which depended on only a static magnetic field. However, magnetic spins can be considered to be excited at an on-resonance, i.e., at a resonance state, regardless of an existence of an excitation for slice selection.

On the other hand, the acquisition method of MR signals with an application of an off-resonance RF signal is known. In this method, an off-resonance RF pulse having a carrier frequency which is different from the resonant frequency by about several kHz is applied to an object. As typical examples of an imaging method using an off-resonance RF pulse, the MTC (magnetization transfer contrast) method, the measuring method of an RF magnetic field (B1) using Bloch-Siegert shift, and the CEST (chemical exchange saturation transfer) method are known.

In the MTC method, an off-resonance RF pulse is applied in advance of a gradient magnetic field pulse for SS in a pulse sequence under the FE (field echo) method, which is also referred to as the GE (gradient echo) method. Moreover, a gradient magnetic field spoiler pulse for spoiling transverse magnetization signals is applied after the application of the off-resonance RF pulse.

The off-resonance RF pulse applied in the MTC method is referred to as the MT (magnetization transfer) pulse. The MT pulse saturates magnetizations of giant molecules in tissues and the protons in bound water to generate an MT (magnetization transfer) to protons in free water. Since this MT effect has a dependency on tissue, using the MT effect makes it possible to make a diagnostic image clear.

Moreover, the off-resonance RF pulse is also used for an acquisition of a distribution image of B1 intensity. The measurement of B1 intensity using the off-resonance RF pulse uses the Bloch-Siegert shift. The Bloch-Siegert shift is the shift in the resonant frequency which arises with a constant rate when MR signals are acquired with applying an RF signal having a frequency close to the observed frequency. Specifically, a phase shift of MR signals, which occurs by an excitation with the on-resonance RF pulse and a subsequent further excitation with the off-resonance RF pulse, is used for imaging.

Generally, when the intensity of the static magnetic field becomes large, the B1 intensity becomes non-uniform inside a living body due to an electric loss and a dielectric loss in the living body. For this reason, there is a possibility that the uniformity in images may deteriorate. Accordingly, the measurement of the B1 intensity is desired for an improvement of ununiformity in the B1 intensity and an estimation of the B1 intensity. Although various techniques are proposed as measuring methods of the B1 intensity, the measuring method of the B1 intensity using an off-resonance RF pulse is one of the few methods which can encode the B1 intensity to the phase of MR signals.

In magnetic resonance imaging (MRI) with application of an off-resonance RF pulse, a change in contrast and artifact due to a phase shift are problems. For this reason, it is desired to improve contrast and image quality much more in MRI with an application of an off-resonance RF pulse.

It is an object of the present invention to provide a magnetic resonance imaging apparatus and a magnetic resonance imaging method which can acquire an MR image having a more improved contrast and image quality applying an off-resonance RF pulse.

PRIOR TECHNICAL LITERATURE

[Patent literature 1] US 2010/0315084 A1

DETAILED DESCRIPTION

In general, according to one embodiment, a magnetic resonance imaging apparatus includes a data acquiring unit and a data processing unit. The data acquiring unit is configured to acquire magnetic resonance signals according to an imaging condition for applying a first off-resonance radio frequency pulse after an application of an excitation pulse and before a readout of the magnetic resonance signals, and applying a second off-resonance radio frequency pulse after the readout of the magnetic resonance signals and before an application of a following excitation pulse. The first off-resonance radio frequency pulse generates a phase shift in the magnetic resonance signals. The second off-resonance radio frequency pulse compensates the phase shift. The data processing unit is configured to obtain information to be obtained by data processing of the magnetic resonance signals.

Further, according to another embodiment, a magnetic resonance imaging apparatus includes a data acquiring unit and a data processing unit. The data acquiring unit is configured to acquire magnetic resonance signals according to an imaging condition for applying a first off-resonance radio frequency pulse, as a magnetization transfer pulse or a radio frequency pulse for measuring a radio frequency magnetic field, after an application of an excitation pulse and before a readout of the magnetic resonance signals, and applying a second off-resonance radio frequency pulse after the readout of the magnetic resonance signals and before an application of a following excitation pulse. The first off-resonance radio frequency pulse generates a phase shift in the magnetic resonance signals. The second off-resonance radio frequency pulse compensates the phase shift. The data processing unit is configured to obtain magnetic resonance image data having a magnetization transfer contrast or an intensity of the radio frequency magnetic field by data processing of the magnetic resonance signals.

Further, according to another embodiment, a magnetic resonance imaging method includes: acquiring magnetic resonance signals according to an imaging condition for applying a first off-resonance radio frequency pulse after an application of an excitation pulse and before a readout of the magnetic resonance signals, and applying a second off-resonance radio frequency pulse after the readout of the magnetic resonance signals and before an application of a following excitation pulse; and obtaining information to be obtained by data processing of the magnetic resonance signals. The first off-resonance radio frequency pulse generates a phase shift in the magnetic resonance signals. The second off-resonance radio frequency pulse compensates the phase shift.

A magnetic resonance imaging apparatus and a magnetic resonance imaging method according to embodiments of the present invention will be described with reference to the accompanying drawings.

Figure 1:
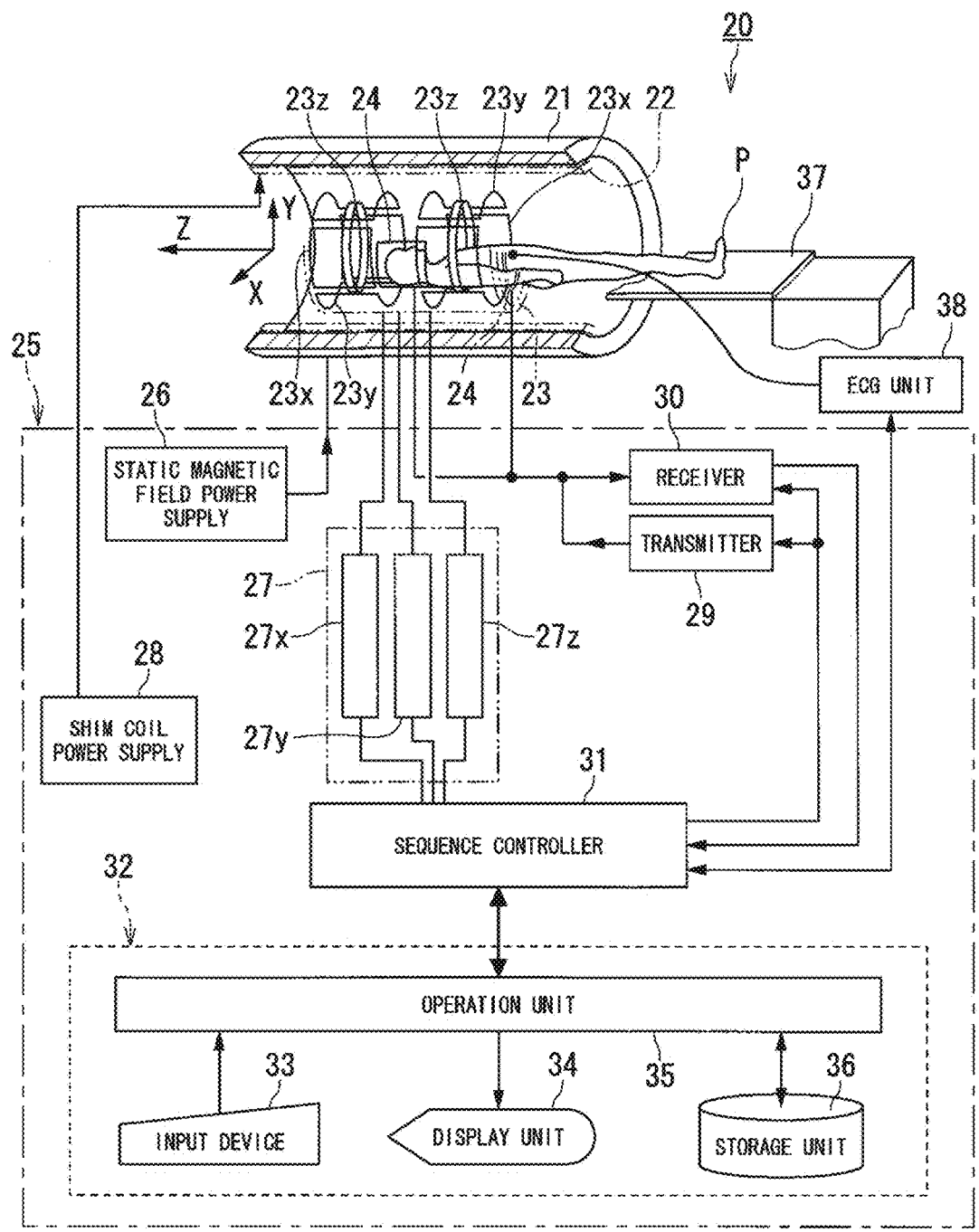
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to get the function to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. The RF coils 24 include a whole body coil (WBC: whole body coil), which is built in the gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with at least one of the transmitter 29 and the receiver 30. The transmission RF coil 24 has a function to transmit an RF signal given from the transmitter 29 to the object P. The reception RF coil 24 has a function to receive MR signals generated due to an nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, application period and application timing of the pulse electric current which should be applied to the gradient power supply 27

The sequence controller 31 is also configured to give raw data to the computer 32. The raw data is complex data obtained through the detection of a MR signal and A/D (analog to digital) conversion to the MR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a MR signal given from the RF coil 24 and performing predetermined signal processing and A/D converting to the MR signal detected. The receiver 30 also has a function to give the generated raw data to the sequence controller 31.

In addition, an ECG (electro cardiogram) unit 38 for acquiring an ECG signal of the object P is provided with the magnetic resonance imaging apparatus 20. The ECG signal detected by the ECG unit 38 is output to the computer 32 through the sequence controller 31.

Note that, a PPG (peripheral pulse gating) signal representing a beat as pulse wave information may be acquired instead of an ECG signal representing the beat as heart rate information. The PPG signal is acquired by detecting a pulse wave of, e.g., a tip of finger, as an optical signal. When the PPG signal is acquired, a PPG signal detection unit is provided with the magnetic resonance imaging apparatus 20.

Furthermore, a breathing signal which represents a motion having a respiratory period can be also used as a gating signal besides a gating signal representing the beat. The breathing signal can be acquired by a breathing signal detection unit which detects the breathing signal by contacting with a breast of an object P or known signal processing based on time series MR signals.

The computer 32 gets various functions by the operation unit 35 executing some programs stored in the storage unit 36 of the computer 32. Alternatively, some specific circuits having various functions may be provided with the magnetic resonance imaging apparatus 20, instead of at least a part of the programs.

Figure 2:
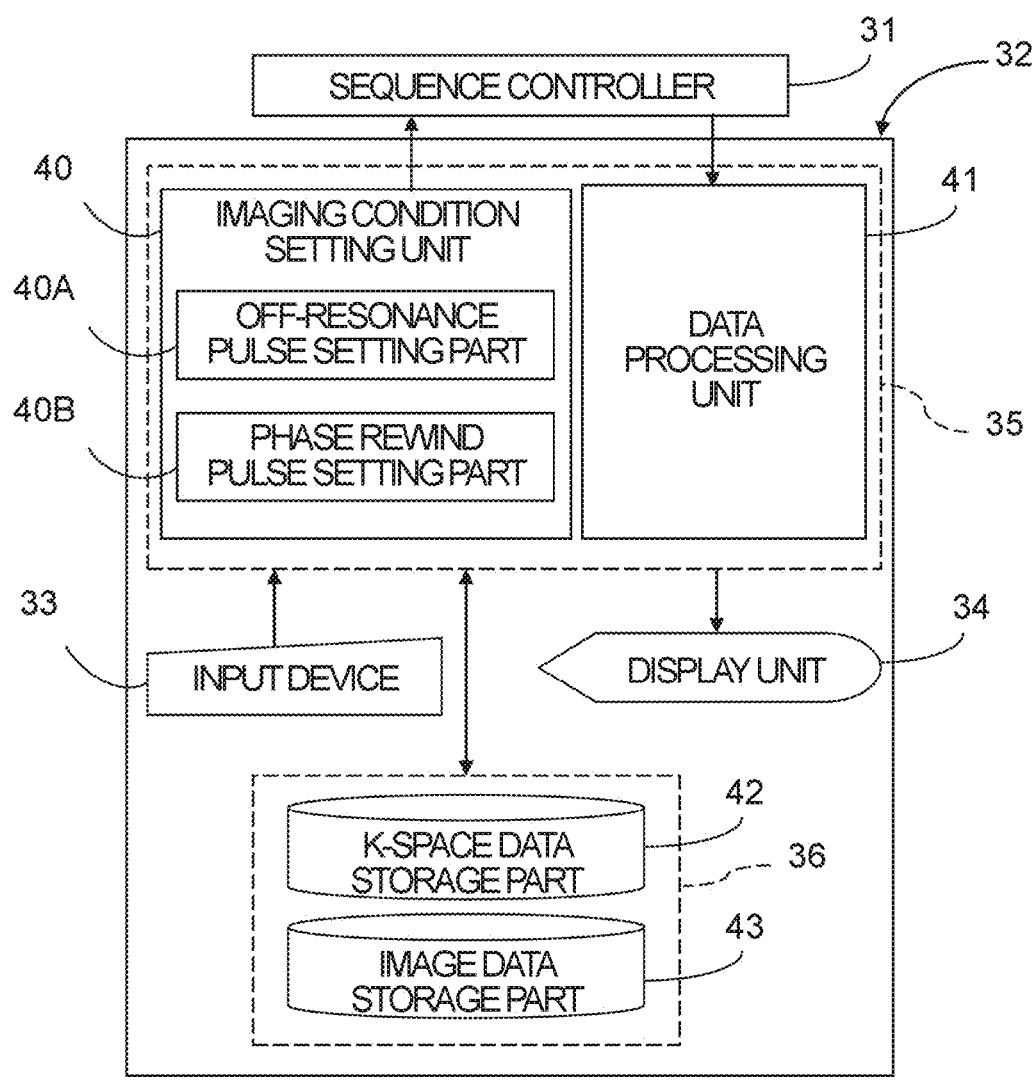
FIG. 2 is a functional block diagram of the computer shown in FIG. 1.

FIG. 2 is a functional block diagram of the computer 32 shown in FIG. 1.

The operation unit 35 of the computer 32 functions as an imaging condition setting unit 40 and a data processing unit 41 by executing the programs stored in the storage unit 36. Moreover, the storage unit 36 functions as a k-space data storage part 42 and an image data storage part 43. Especially the imaging condition setting unit 40 has an off-resonance pulse setting part 40A and a phase rewind pulse setting part 40B.

The imaging condition setting unit 40 has a function to set imaging conditions including a pulse sequence based on information input from the input device 33 and output the set imaging conditions to the sequence controller 31. Especially the imaging condition setting unit 40 has a function to set imaging conditions with application of off-resonance RF pulses, having a desired purpose, and phase rewind RF pulses, each rewinding a rotation of the phase shifted by an application of an off-resonance RF pulse.

The off-resonance pulse setting part 40A of the imaging condition setting unit 40 has a function to set up application conditions of the off-resonance RF pulses, such as flip angles, frequencies, and application timings of the off-resonance RF pulses. Meanwhile, the phase rewind pulse setting part 40B has a function to set up application conditions of the phase rewind RF pulses, such as flip angles, frequencies, and application timings of the phase rewind RF pulses.

Figure 3:
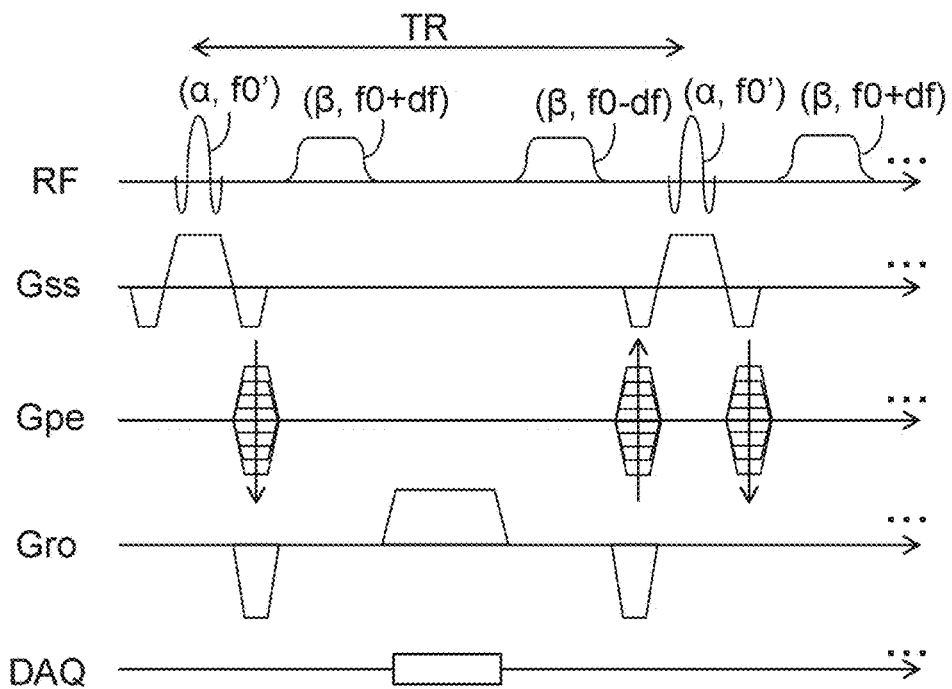
FIG. 3 is a chart showing an example of SSFP sequence set up in the imaging condition setting unit shown in FIG. 2.

FIG. 3 is a chart showing an example of SSFP sequence set up in the imaging condition setting unit 40 shown in FIG. 2.

In FIG. 3, the horizontal axis represents the time, RF represents RF pulses, Gss represents gradient magnetic field pulses in a SS direction, Gpe represents gradient magnetic field pulses in a PE (phase encode) direction, Gro represents gradient magnetic field pulses in an RO (readout) direction, DAQ represents data acquisitions. They are the same in the pulse sequences shown henceforth.

As shown in FIG. 3, an on-resonance RF pulse whose flip angle is $\alpha$ and carrier frequency is f0' is applied to a predetermined area to be imaged, with a gradient magnetic field pulse for SS, as the RF excitation pulse for generating MR signals. Moreover, a gradient magnetic field pulse for PE and a gradient magnetic field pulse for a compensation of the gradient magnetic field moment in an RO direction are applied immediately after the excitation pulse.

After that, the first off-resonance RF pulse whose flip angle is $\beta$ and carrier frequency is f0+df (df≠0) is applied. The carrier frequency f0+df of the first off-resonance RF pulse is the sum of the resonant frequency f0 of MR signals under the static magnetic field and an off-resonance frequency df equivalent to a shift amount in frequency from the resonant frequency. As the first off-resonance RF pulse, an RF pulse which has a waveform according to an imaging purpose, such as a Fermi pulse having a waveform defined by a Fermi function, a rectangular pulse, or a hyperbolic secant pulse, can be used.

After the application of the first off-resonance RF pulse, a gradient magnetic field pulse for RO is applied. Thereby, the data acquisition of MR signals is performed. Therefore, the first off-resonance RF pulse functions as an RF phase encoding pulse which shifts the phase of the MR signals by a predetermined variation.

After the read-out of the MR data, the second off-resonance RF pulse is applied. Although the second off-resonance RF pulse is applied with the flip angle $\beta$ same as that of the first off-resonance RF pulse, its carrier frequency is f0−df. That is, the carrier frequency f0−df of the second off-resonance RF pulse is the sum of the resonant frequency f0 of the MR signals under the static magnetic field and an off-resonance frequency −df to the resonant frequency. Furthermore, the off-resonance frequency −df of the second off-resonance RF pulse has a same absolute value and a different sign as and from those of the off-resonance frequency df of the first off-resonance RF pulse.

Therefore, the phase encoding by the first off-resonance RF pulse is rewound by the second off-resonance RF pulse. In other words, the phase shift by the first off-resonance RF pulse is compensated by the second off-resonance RF pulse.

After the application of the second off-resonance RF pulse, a gradient magnetic field pulse for PE and a gradient magnetic field pulse for the compensation of the gradient magnetic field moment in the RO direction are applied. After that, similar applications of RF pulses and gradient magnetic field pulses following the next excitation pulse can be repeated with a constant TR depending on the imaging purpose.

Figure 4:
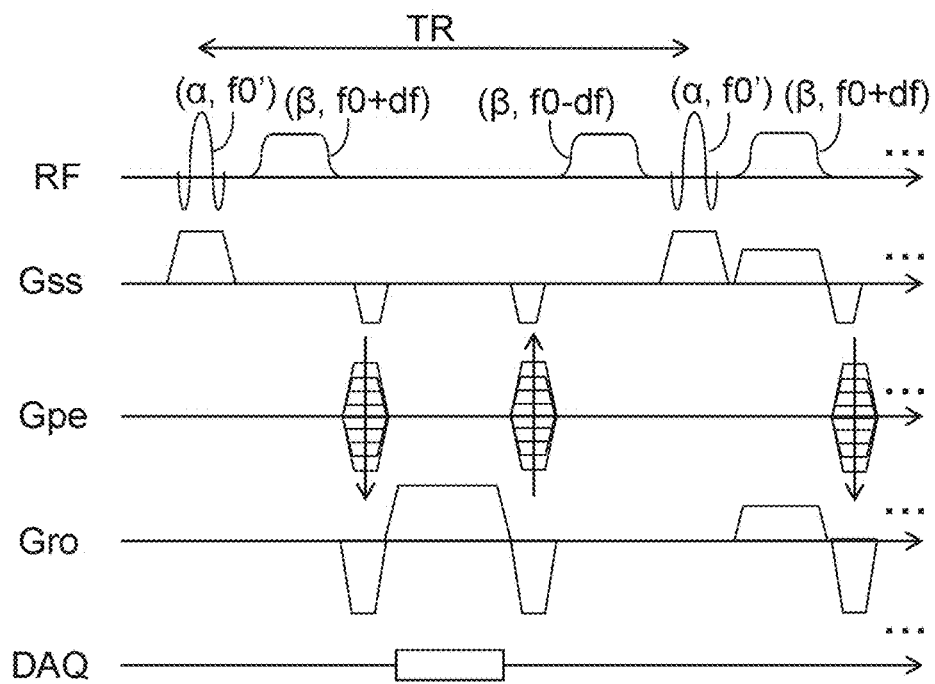
FIG. 4 is a chart showing another example of SSFP sequence set up in the imaging condition setting unit shown in FIG. 2.

FIG. 4 is a chart showing another example of SSFP sequence set up in the imaging condition setting unit 40 shown in FIG. 2.

As shown in FIG. 4, the first off-resonance RF pulse may be applied between the excitation pulse and the gradient magnetic field pulse for PE before the read-out of data with applying the second off-resonance RF pulse between the gradient magnetic field pulse for PE after the read-out of data and the next excitation pulse. Namely, as long as the gradient magnetic field pulse for RO is applied between the first off-resonance RF pulse and the second off-resonance RF pulse, a gradient magnetic field pulse other than the RO gradient magnetic field pulse may be applied between the first off-resonance RF pulse and the second off-resonance RF pulse.

As shown in FIG. 3 and FIG. 4, applying the first off-resonance RF pulse and the second off-resonance RF pulse, whose off-resonance frequencies have the mutually same absolute value and the mutually opposite polarities, before and after the application of the gradient magnetic field pulse for RO, i.e., the MR data acquisition, makes it possible to cancel the phase shift, which arises within the TR by the application of the first off-resonance RF pulse, by the phase rewind effect of the second off-resonance RF pulse.

Therefore, the first off-resonance RF pulse having a desired purpose can be applied with a desired flip angle β and off-resonance frequency df, after the application of the excitation pulse precedential to the read-out of MR signals. For example, the first off-resonance RF pulse can be applied as an RF pulse, such as an MT pulse, an off-resonance RF pulse for B1 measurement, or an off-resonance RF pulse for an imaging by the CEST method, after the application of the excitation pulse. Note that, the off-resonance RF pulse may be applied as a prepulse depending on an imaging purpose, as needed.

Figure 5:
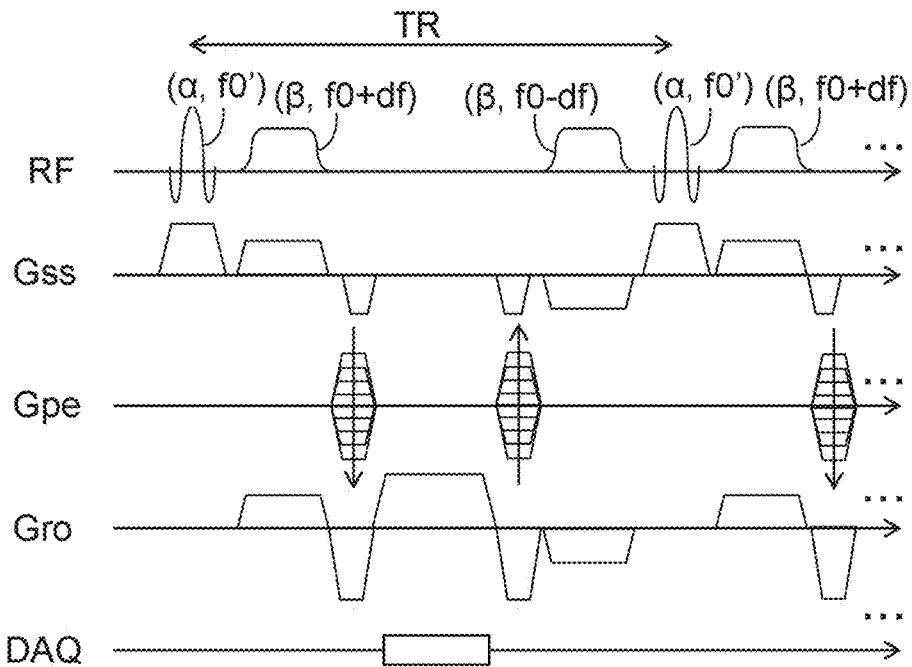
FIG. 5 is a chart showing an example of setting an application of gradient magnetic field pulses simultaneously with the first and second off-resonance RF pulses shown in FIG. 4.

FIG. 5 is a chart showing an example of setting an application of gradient magnetic field pulses simultaneously with the first and second off-resonance RF pulses shown in FIG. 4.

As shown in FIG. 5, gradient magnetic field pulses may be applied in arbitrary axis directions simultaneously with the first off-resonance RF pulse according to a purpose of applying the first off-resonance RF pulse. In this case, gradient magnetic field pulses, whose polarities are opposite to those of the gradient magnetic field pulses applied simultaneously with the first off-resonance RF pulse, are applied simultaneously with the second off-resonance RF pulse for the adjustment of the gradient magnetic field moment.

In the example shown in FIG. 5, gradient magnetic field pulses for region selections are applied in the SS direction and the RO direction simultaneously with the first and second off-resonance RF pulses. Of course, gradient magnetic field pulses may be applied simultaneously with the first and second off-resonance RF pulses in the SSFP sequence shown in FIG. 3. The MT pulse applied with a gradient magnetic field pulse for region selection is also referred to as a SORS (slice selective off-resonance sinc pulse).

As mentioned above, the absolute values of the respective off-resonance frequencies ±df of the first and second off-resonance RF pulses are set up to become the same. Actually, an error range of the off-resonance frequency df is set so that image qualities of acquired images and/or an accuracy of a measuring target, such as the B1 intensity, satisfies a required quality. Therefore, the range of a tolerance in the off-resonance frequency df is dependent on the imaging purpose. In fact, it is realistic to make the range of the tolerance in the off-resonance frequency df within several percent.

Figure 6:
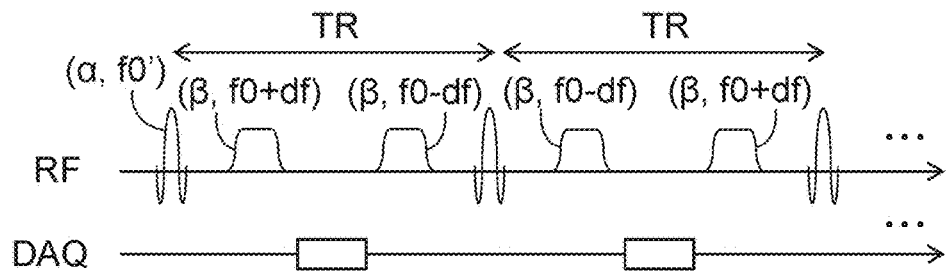
FIG. 6 is a chart showing an example of varying the off-resonance frequencies for every TR in the SSFP sequence shown in FIG. 3 or FIG. 4.
Figure 7:
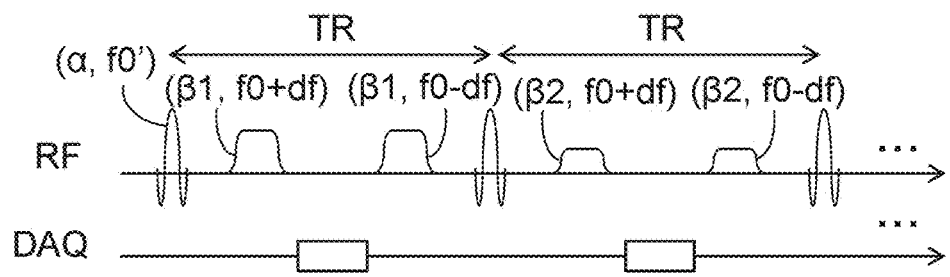
FIG. 7 is a chart showing an example of varying the flip angles for every TR in the SSFP sequence shown in FIG. 3 or FIG. 4.

Moreover, at least one of the off-resonance frequencies and the intensities of the first off-resonance RF pulse and the second off-resonance RF pulse may be also varied for every TR for the acquisition of MR signals. FIG. 6 is a chart showing an example of varying the off-resonance frequencies for every TR in the SSFP sequence shown in FIG. 3 or FIG. 4. Meanwhile, FIG. 7 is a chart showing an example of varying the flip angles for every TR in the SSFP sequence shown in FIG. 3 or FIG. 4.

Specifically, as shown in FIG. 6, the polarity of the off-resonance frequency df of the first off-resonance RF pulse can be alternately inverted for every TR. Meanwhile, the flip angle can be also varied into mutually different angles β1, β2, β3, . . . between TRs, which are constant, as shown in FIG. 7.

In case of a measurement of the B1, imaging under the MTC method, or imaging under the CEST method, the data acquisition conditions by which the first off-resonance RF pulse is repeatedly applied with inverting the polarity of the off-resonance frequency df alternately as shown in FIG. 6 are practical. Alternatively, the absolute value of the off-resonance frequency may be varied into mutually different values df1, df2, df3, . . . between TRs, which are constant. In case of imaging under the MTC method or imaging under the CEST method, varying the absolute value of the off-resonance frequency between TRs, which are constant, according to an imaging purpose is sometimes useful.

Figure 8:
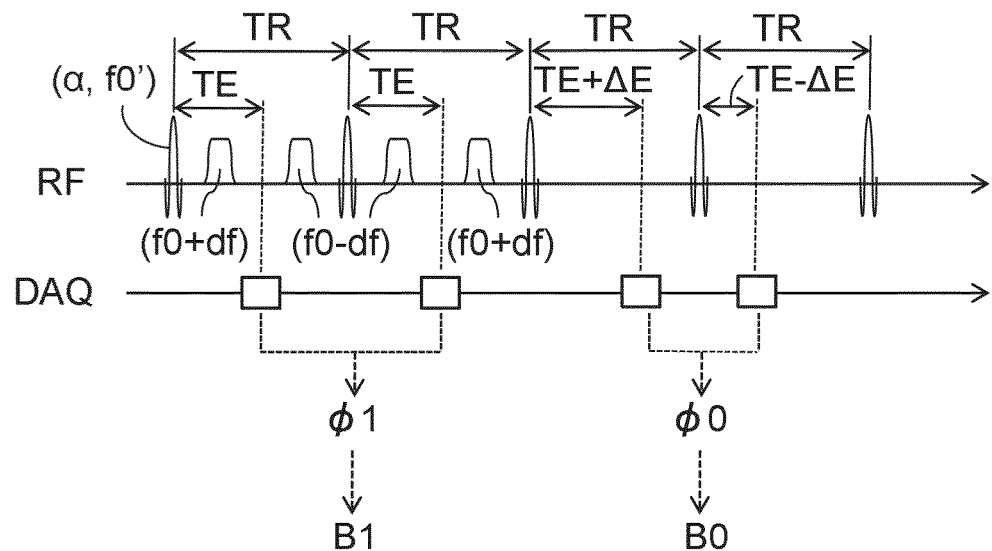
FIG. 8 is a chart showing an example of pulse sequence for measuring the B1 intensity set in the imaging condition setting unit shown in FIG. 2 and a method of obtaining the B1 intensity.

FIG. 8 is a chart showing an example of pulse sequence for measuring the B1 intensity set in the imaging condition setting unit 40 shown in FIG. 2 and a method of obtaining the B1 intensity.

As shown in FIG. 8, a pulse sequence for measurement of the B1 intensity and the B0 intensity with the application of the first and second off-resonance RF pulses can be also set. Specifically, both the B1 intensity and the B0 intensity can be obtained by the pulse sequence for acquiring MR signals corresponding to a same PE amount at least twice with varying the respective off-resonance frequencies of the first and second off-resonance RF pulses and acquiring MR signals corresponding to the same PE amount twice with varying the TE (echo time) with applying neither the first off-resonance RF pulse nor the second off-resonance RF pulse. In other words, the pulse sequence can be set so that MR signals corresponding to a same PE amount are acquired twice, with applying neither the first off-resonance RF pulse nor the second off-resonance RF pulse, with mutually different two TEs, each differing from the TE for the acquisition of MR signals with applying the first and second off-resonance RF pulses, as shown in FIG. 8.

As shown in FIG. 8, the off-resonance frequencies of the first off-resonance RF pulse can be set typically so that the polarities are mutually opposite and the absolute values are mutually same. Moreover, the first data acquisition conditions for acquiring MR signals without applying an off-resonance RF pulse with a TE shifted by +ΔTE from a TE for MR signals acquired with applying the first and second off-resonance RF pulses, and the second data acquisition conditions for acquiring MR signals without applying an off-resonance RF pulse with a TE shifted by −ΔTE can be set as a practical example.

When the sequence shown in FIG. 8 is performed, a difference in phase φ1 between the two trains of MR signals, acquired with the mutually different off-resonance frequencies with the application of the first off-resonance RF pulse, can be obtained. Then, the phase difference φ1 can be considered to be the phase shift which arose under the influence of only the difference between the respective off-resonance frequencies ±df of the first off-resonance RF pulse. Therefore, the B1 distribution can be measured based on the phase difference φ1.

Moreover, the phase difference φ0 between the two trains of MR signals acquired with varying the TE into TE±ΔE without applying an off-resonance RF pulse can be considered to be the phase shift which arose under the influence of only the static magnetic field. Therefore, the b0 distribution can be measured based on the phase difference φ0.

Figure 9:
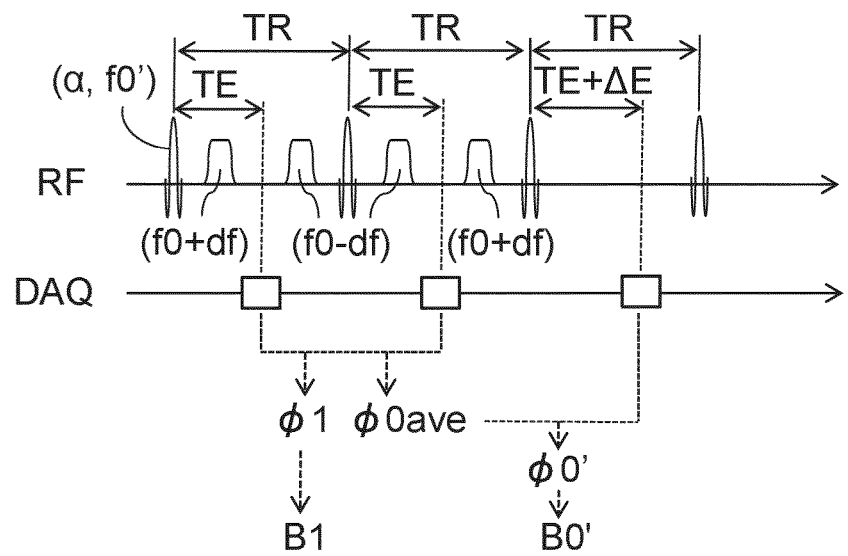
FIG. 9 is a chart showing another example of pulse sequence for measuring the B1 intensity set in the imaging condition setting unit shown in FIG. 2 and another method of obtaining the B1 intensity.

FIG. 9 is a chart showing another example of pulse sequence for measuring the B1 intensity set in the imaging condition setting unit 40 shown in FIG. 2 and another method of obtaining the B1 intensity.

On the other hand, as shown in FIG. 9, one of the acquisitions of the MR signals without the application of an off-resonance RF pulse can be omitted in the sequence shown in FIG. 8. In other words, a sequence which acquires MR signals once without applying an off-resonance RF pulse may be set. In this case, the phase average φ0ave between the two trains of MR signals acquired with the mutually different off-resonance frequencies with the application of the first off-resonance RF pulse is calculated. Then, the phase average φ0ave can be considered to be the phase from which the influence of the off-resonance RF pulse has been approximately canceled.

Therefore, when the phase difference φ0' of the MR signals, acquired without applying an off-resonance RF pulse, from the phase average φ0ave serving as a basis is calculated, the phase difference φ0' can be considered as a phase shift amount of the MR signals under the influence of only the difference between the TEs. Therefore, a rough b0 distribution (b0') can be measured based on the phase difference φ0'.

As shown in FIG. 8 and FIG. 9, acquiring MR signals corresponding to the PE amount same as the PE amount of the MR signals acquired after the application of the first off-resonance RF pulse, at least once, with a TE different from the TE of MR signals acquired after the application of the first off-resonance RF pulse, without applying an off-resonance RF pulse, makes it possible to obtain both the b1 intensity and the b0 intensity. Note that, the order of the acquisition of the MR signals with the application of the first off-resonance RF pulse and that without the application of the first off-resonance RF pulse can be changed arbitrarily as well as the examples of FIG. 8 and FIG. 9.

Moreover, by repeating the data acquisition shown in FIG. 8 or FIG. 9 with varying the PE amount, each of a B1 map and a B0 map can be obtained as 2D (two dimensional) data in the RO direction and the PE direction. On the other hand, if the PE amount is not varied, each of a B1 map and a B0 map can be obtained as projection data to the PE direction.

According to the sequence shown in FIG. 8 or FIG. 9, the influence of the phase shift of the MR signals by the off-resonance frequency of the first off-resonance RF pulse can be canceled in a single TR. Therefore, the B1 map and the B0 map can be acquired with a high precision. In addition, a data acquisition period can be shortened by continuously acquiring the MR signals for measuring the B1 and the B0.

Furthermore, as shown in FIG. 9, the number of the acquisitions of the MR signals with a same PE amount without the application of an off-resonance RF pulse can be one. As a result, a data acquisition period for a measurement of the B1 map and the B0 map can be shortened.

Then, the sequence for a measurement of the B1 intensity as shown in FIG. 8 or FIG. 9 can be used not only as a sequence for a prescan but as a part of an imaging sequence.

Figure 10:
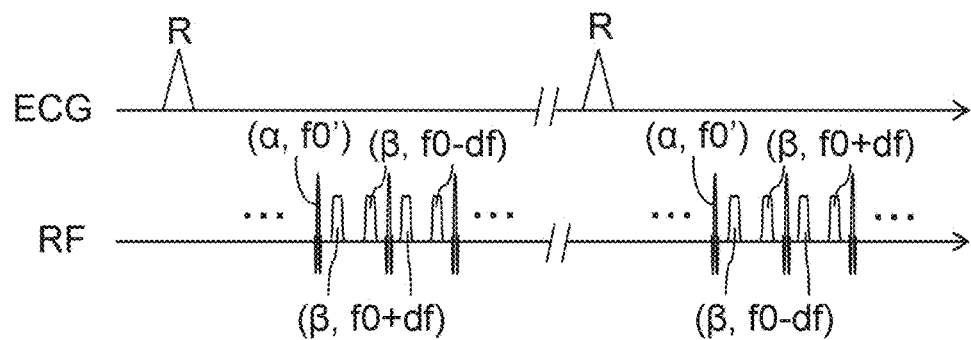
FIG. 10 is a chart showing an example of pulse sequence for an ECG synchronized imaging set in the imaging condition setting unit shown in FIG. 2.

FIG. 10 is a chart showing an example of pulse sequence for an ECG synchronized imaging set in the imaging condition setting unit 40 shown in FIG. 2.

In FIG. 10, ECG represents an ECG signal. As shown in FIG. 10, in a multi-echo data acquisition sequence for an ECG synchronized imaging using reference waves, such as the R waves, of an ECG signal as triggers, the application of the first and second off-resonance RF pulses can be set between adjacent excitation pulses. Specifically, the first and second off-resonance RF pulses can be applied repeatedly using an ECG signal as a gating signal.

FIG. 10 shows an example of making the off-resonance frequency of the first off-resonance RF pulse constant during one heart rate (1RR) and changing the polarity of the off-resonance frequency of the first off-resonance RF pulse between adjacent heart rates. Therefore, two trains of MR signals corresponding to the positive and negative off-resonance frequencies are acquired with a same PE amount. For example, all the MR signals corresponding to the required PE amounts and the positive and negative off-resonance frequencies can be acquired by changing the PE amount every two heart rates.

Moreover, MR signals corresponding to a part of PE amounts may be acquired in one heart rate instead of acquiring the MR signals corresponding to all the PE amounts. In this case, the PE amount for the acquisition of MR signals corresponding to a same off-resonance frequency changes for every heart rate, and MR signals corresponding to the required PE amounts are acquired over two or more heart rates. In other words, the application of the first and second off-resonance RF pulses can be set between excitation pulses of an SSFP sequence by the segment k-space method. The segment k-space method is a data acquisition method by which the k-space is divided into two or more segments and the k-space is filled up with data by acquiring MR signals sequentially for every segment.

Note that, it is also possible to use a pulse wave or a breathing signal as a gating signal for a synchronized imaging as mentioned above as well as an ECG signal On the contrary, the application of the first and second off-resonance RF pulses can be also set to an SSFP sequence for an asynchronous imaging under the segment k-space method.

Figure 11:
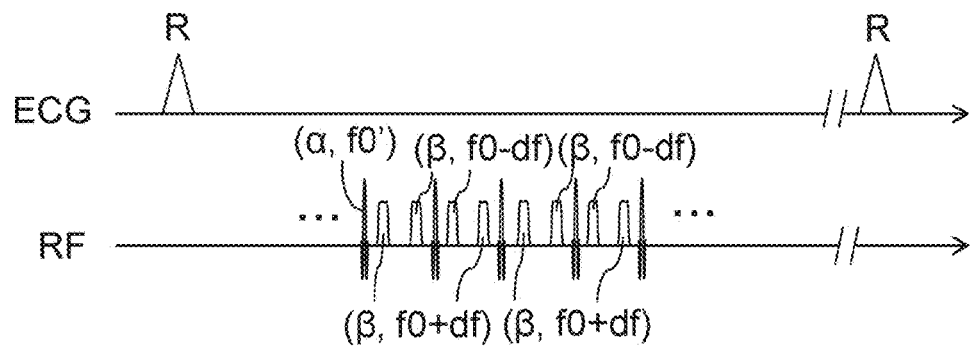
FIG. 11 is a chart showing an example of pulse sequence for an ECG synchronized cine imaging set in the imaging condition setting unit 40 shown in FIG. 2.

FIG. 11 is a chart showing an example of pulse sequence for an ECG synchronized cine imaging set in the imaging condition setting unit 40 shown in FIG. 2.

As shown in FIG. 11, the application of the first and second off-resonance RF pulses can be also set to an SSFP sequence for an ECG synchronized cine imaging. In this case, it is necessary to acquire MR signals corresponding to respective PE amounts for every cardiac time phase equivalent to a delay time from the R wave.

Accordingly, by continuing the acquisitions of MR signals with the first and second off-resonance RF pulses whose respective off-resonance frequencies have the mutually opposite polarities as shown in FIG. 11, MR signals corresponding to mutually different off-resonance frequencies can be acquired at cardiac time phases which can be considered as same. In other words, the phase shift effect by the off-resonance RF pulses can be given to the MR signals corresponding to respective cardiac time phases.

In this case, the SSFP sequence for an ECG synchronized cine imaging has conditions for acquiring MR signals repeatedly with alternately inverting the respective polarities of the off-resonance frequencies of the first and second off-resonance RF pulses. That is, since the phase shift of MR signals by the first off-resonance RF pulse is canceled within each TR by the compensation effect to the phase shift by the second off-resonance RF pulse, the off-resonance frequency can be changed quickly between continuous TRs. Note that, the PE amount is to be changed for every two TRs.

However, as shown in FIG. 10, the polarity of the off-resonance frequency may be changed for every heart rate to acquire MR signals at every cardiac time phase for a cine imaging. Moreover, besides a cine imaging, the application of the first and second off-resonance RF pulses can be also set in a pulse sequence for a synchronous dynamic imaging or an asynchronous dynamic imaging.

By the way, in order to generate a sufficient phase shift in MR signals by the application of the off-resonance RF pulse, it is required to enlarge the intensity of the off-resonance RF pulse enough. However, when the intensity of the off-resonance RF pulse is enlarged, there is a problem that the SAR (specific absorption rate), which is an index showing a size of an absorbed energy of RF signals to the human body, goes up.

Accordingly, as a method for reducing the SAR, securing a spare time during which RF pulses including the off-resonance RF pulse are not applied to the object P and making the intensity of an off-resonance RF pulse variable are effective.

In case of reducing the SAR by securing a spare time, what is necessary is just to perform data acquisitions of MR signals intermittently by making the number of the data acquisitions per unit time not more than a certain number in a pulse sequence for a synchronous imaging or an asynchronous imaging.

On the other hand, the rise of the SAR can be also suppressed by varying the intensities of the first and second off-resonance RF pulses according to a PE amount, i.e., an intensity of the corresponding gradient magnetic field pulse for PE.

Figure 12:
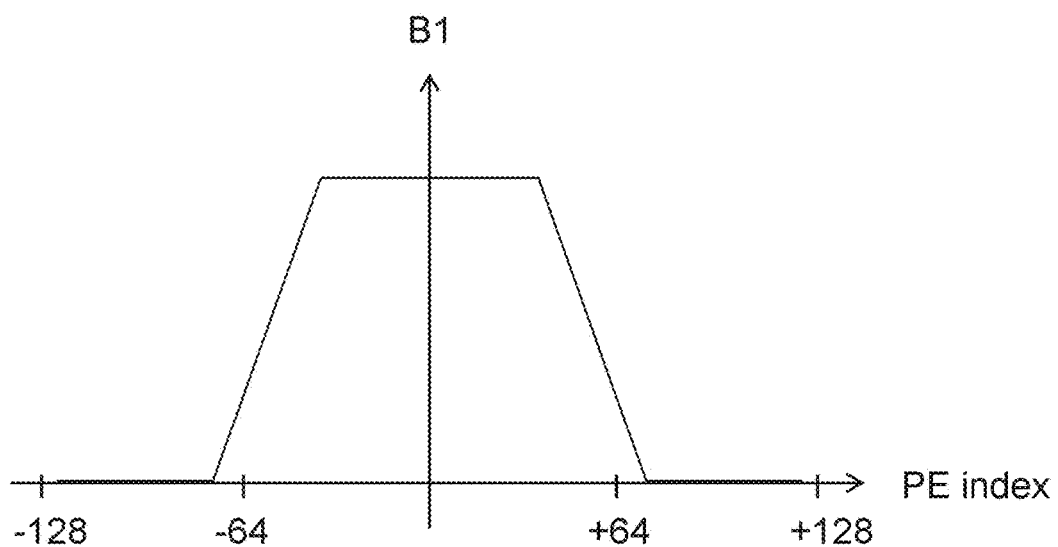
FIG. 12 is a graph which shows the intensities of the off-resonance RF pulse set in the imaging condition setting unit shown in FIG. 2.

FIG. 12 is a graph which shows the intensities of the off-resonance RF pulse set in the imaging condition setting unit 40 shown in FIG. 2.

In FIG. 12, the horizontal axis represents the index of the PE amount, and the vertical axis represents the B1 intensity of the off-resonance RF pulse. The object P is put inside the whole body coil. Therefore, it is expected that the B1 distribution becomes spatially smooth in case of transmitting the off-resonance RF pulse from the whole body coil. Therefore, in case of acquiring MR signals in the high frequency area of the k-space corresponding to large PE amounts, there is no trouble in the imaging purpose in many cases even if the intensity of the off-resonance RF pulse is decreased In such a case, as shown in FIG. 12, the intensity of the off-resonance RF pulse can be set to be large relatively for the acquisition of MR signals in the low frequency area of the k-space corresponding to small PE amounts and small relatively for the acquisition of MR signals in the high frequency area of the k-space corresponding to large PE amounts. As a result, the sum total of the application intensities of the off-resonance RF pulses and the SAR can be reduced.

Although the SSFP sequence has been mainly explained as an example so far, the first and second off-resonance RF pulses can be also set in an SE sequence including a derivative sequence, such as an FFE (fast field echo) sequence, and an FE sequence including a derivative sequence, such as an FSE (fast spin echo) sequence.

Figure 13:
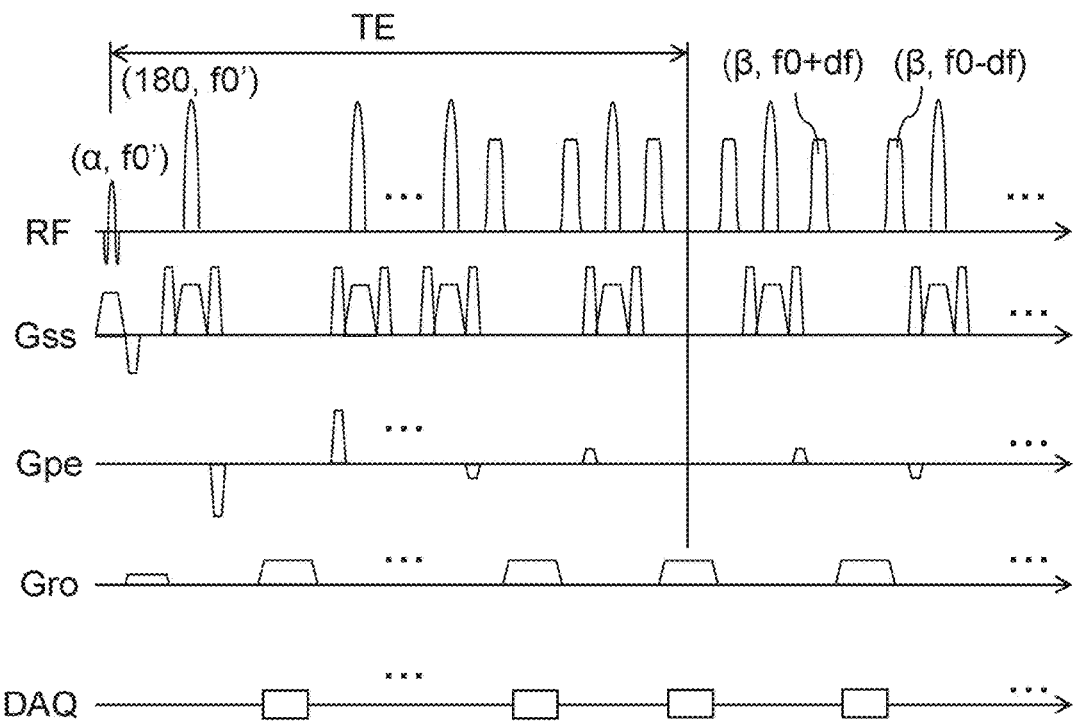
FIG. 13 is a chart showing an example of FSE sequence set in the imaging condition setting unit shown in FIG. 2.

FIG. 13 is a chart showing an example of FSE sequence set in the imaging condition setting unit 40 shown in FIG. 2.

As shown in FIG. 13, in an FSE sequence, the on-resonance RF pulse, whose flip angle is α and carrier frequency is f0', is applied to a predetermined area to be imaged, as an excitation pulse, with a gradient magnetic field pulse for SS. Next, an inversion refocus pulse, whose flip angle is 180 degrees and carrier frequency is f0', is applied repeatedly with a gradient magnetic field pulse for SS. Between adjacent inversion refocus pulses, two PE gradient magnetic field pulses whose signs are mutually opposite are applied. Between the PE gradient magnetic field pulses, the gradient magnetic field pulse for RO is applied. Moreover, the PE gradient magnetic field pulse, which has the intensity having a different absolute value, is applied sequentially whenever the inversion refocus pulse is applied so that the PE amount changes whenever the inversion refocus pulse is applied.

By the FSE sequence as described above, MR signals corresponding to mutually different PE amounts are continuously acquired between respective PE gradient magnetic field pulses. Moreover, MR signals whose PE amounts are zero corresponding to the center of the k-space are acquired after a TE from the application of the excitation pulse.

Furthermore, the first off-resonance RF pulse can be applied before the readout of the MR data by the application of the RO gradient magnetic field pulse while the second off-resonance RF pulse can be applied after the readout of the MR data by the application of the RO gradient magnetic field pulse. Therefore, the phase shift due to the application of the first off-resonance RF pulse can be rephased by the phase rephase function of the second off-resonance RF pulse.

Therefore, when the FSE sequence is a CPMG (Carr Purcell Meiboom Gill sequence), the important phase coherence can be kept. Note that, the CPMG is a sequence for acquiring MR signals with changing phases of RF pulses in order to suppress phase errors due to the applications of the RF pulses.

Moreover, as explained with reference to the graph shown in FIG. 12, the intensities of the first and second off-resonance RF pulses can be made into zero or small values before and after the readout of the MR signals, in the high frequency area of the k-space, corresponding to the PE gradient magnetic field pulses having large intensities. Thereby, the SAR can be reduced.

Note that, the first and second off-resonance RF pulses may be applied in a Hybrid EPI (hybrid echo planer imaging) sequence for acquiring MR signals by applying RO gradient magnetic field pulses, having mutually opposite polarities, between inversion refocus pulses as well as an FSE sequence for applying one RO gradient magnetic field pulse, having a single polarity, between inversion refocus pulses as shown in FIG. 13. In this case, plural trains of MR signals are to be acquired between the first off-resonance RF pulse and the second off-resonance RF pulse. The Hybrid EPI sequence is also referred to as GRASE (gradient and spin echo) sequence.

Figure 14:
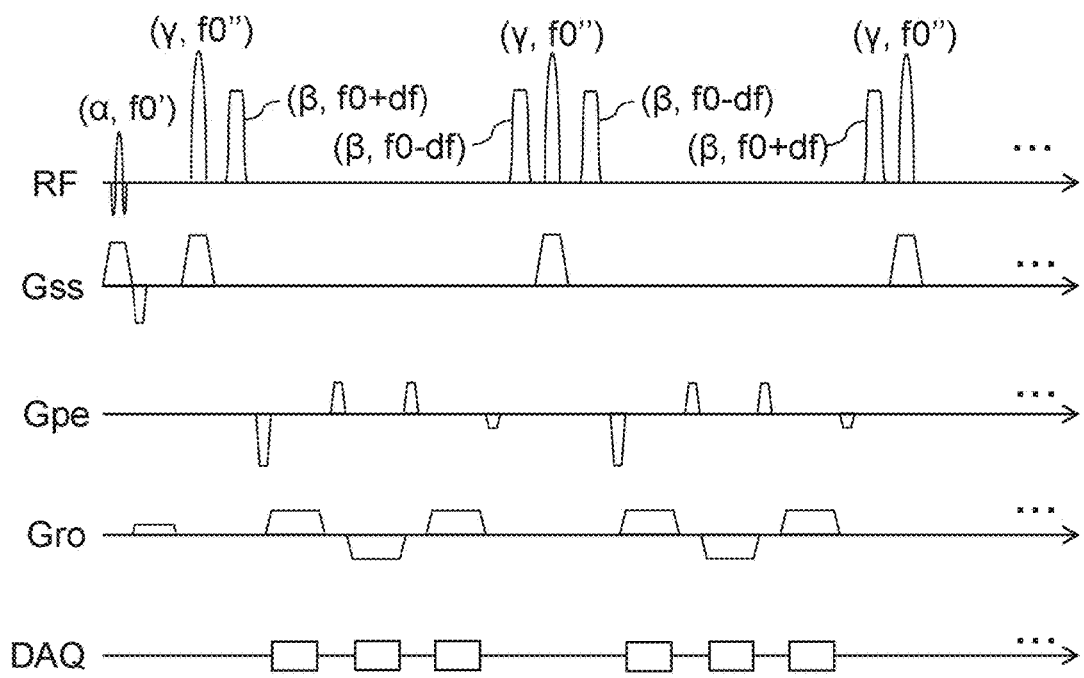
FIG. 14 is a chart showing an example of Hybrid EPI sequence set in the imaging condition setting unit shown in Fig.

FIG. 14 is a chart showing an example of Hybrid EPI sequence set in the imaging condition setting unit 40 shown in FIG. 2.

As shown in FIG. 14, in a Hybrid EPI sequence, the on-resonance RF excitation pulse, whose flip angle is α and carrier frequency is f0', is applied with an SS gradient magnetic field pulse and subsequently the on-resonance RF refocus pulse, whose flip angle is γ and carrier frequency is f0", is repeatedly applied with an SS gradient magnetic field pulse. Between adjacent refocus pulses, RO gradient magnetic field pulses of which polarities are alternately opposite. Between the RO gradient magnetic field pulses, a PE gradient magnetic field pulse is applied. Therefore, trains of MR signals corresponding to mutually different PE amounts are continuously acquired between adjacent refocus pulses.

Accordingly, the first off-resonance RF pulse can be applied between the SS gradient magnetic field pulse and the first PE gradient magnetic field pulse applied before the readout of MR signals within the TR or between the first PE gradient magnetic field pulse applied before the readout of MR signals and the RO gradient magnetic field pulse. Moreover, the second off-resonance RF pulse can be applied between the last RO gradient magnetic field pulse within the TR and the last PE gradient magnetic field pulse or between the last PE gradient magnetic field pulse and the SS gradient magnetic field pulse Thereby, the phase encoding effect of MR signals by the first off-resonance RF pulse and the phase rewind effect of MR signals by the second off-resonance RF pulse as mentioned above can be also obtained in a Hybrid EPI sequence.

On the other hand, the data processing unit 41 of the computer 32 has a function to obtain MR signals, acquired by an imaging scan under the imaging conditions set in the imaging condition setting unit 40, from the sequence controller 31 to arrange the MR signals in the k-space formed in the k-space data storage part 42; a function to take k-space data from the k-space data storage part 42 to reconstruct image data by image reconstruction processing including the FT (Fourier transform); a function to write the reconstructed image data in the image data storage part 43; and a function to perform necessary image processing of the image data taken from the image data storage part 43 to display the processed image data on the display unit 34.

Next, an operation and an action of the magnetic resonance imaging apparatus 20 will be described.

Figure 15:
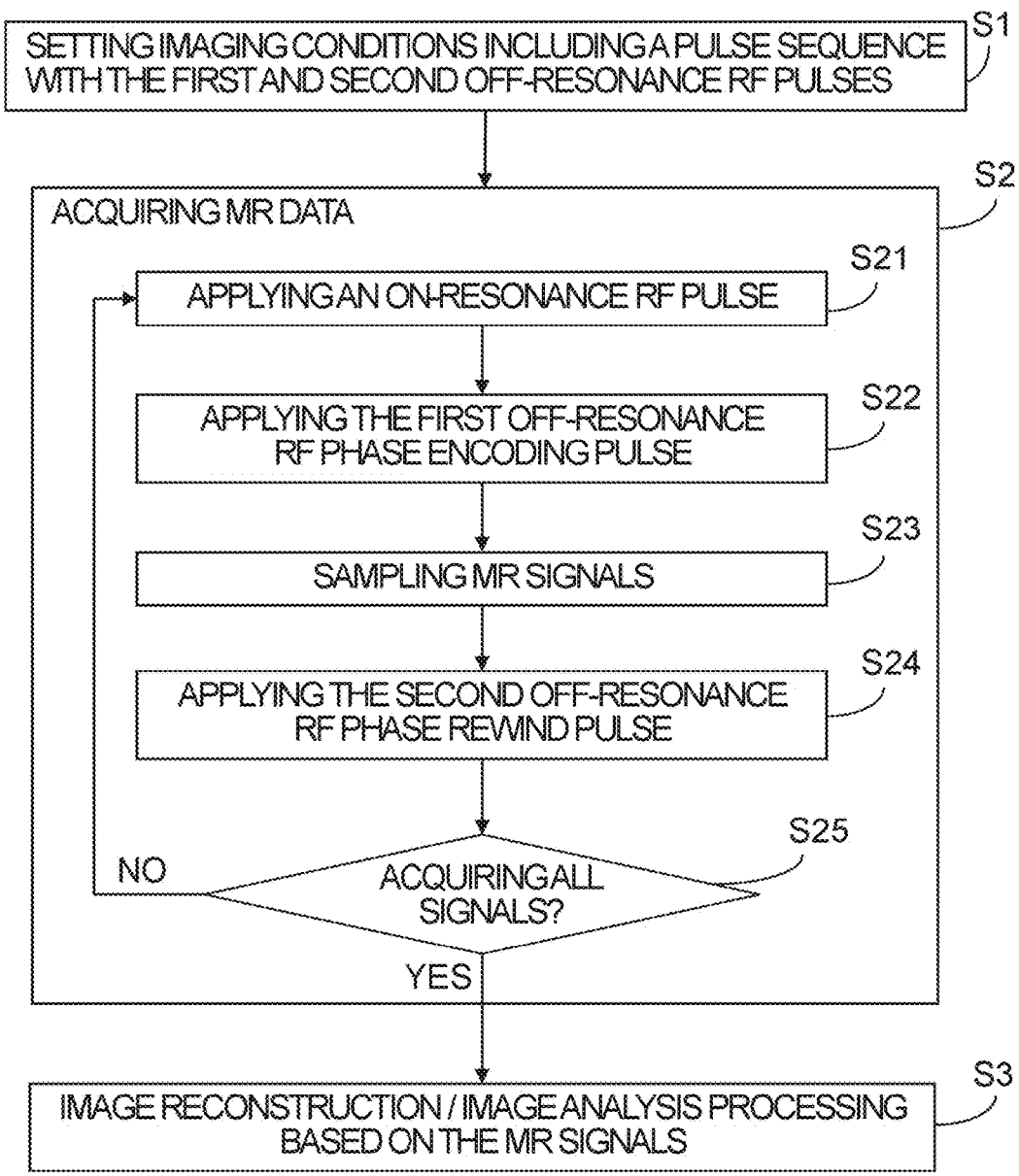
FIG. 15 is a flow chart which shows a flow for imaging an object P with the application of the first and second off-resonance RF pulses by the magnetic resonance imaging apparatus shown in FIG. 1.

FIG. 15 is a flow chart which shows a flow for imaging an object P with the application of the first and second off-resonance RF pulses by the magnetic resonance imaging apparatus 20 shown in FIG. 1.

First, in step S1, the imaging condition setting unit 40 sets imaging conditions including a pulse sequence with the applications of an off-resonance RF pulse having a desired purpose and a phase rewind RF pulse for rewinding the rotation in phase shifted due to the application of the off-resonance RF pulse. Specifically, the imaging conditions are set in the imaging condition setting unit 40 so that the first off-resonance RF pulse for generating a phase shift in MR signals is applied after the application of the excitation pulse and before the readout of the MR signals while the second off-resonance RF pulse for compensating the phase shift is applied after the readout of the MR signals and before the following application of the excitation pulse, as shown in FIGS. 3 to 11, FIG. 13, or FIG. 14.

Next, in step S2, the components, such as the sequence controller 31 and the static field magnet 21, for performing a scan of the magnetic resonance imaging apparatus 20 acquires MR signals according to the imaging conditions set in the imaging condition setting unit 40.

For that purpose, the object P is set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Then, a direction to start a data acquisition is given from the input device 33 to the imaging condition setting unit 40. Accordingly, the imaging condition setting unit 40 outputs the imaging conditions including the pulse sequence to the sequence controller 31. Therefore, the sequence controller 31 drives the gradient power supply 27, the transmitter 29, and the receiver 30 in accordance with the imaging conditions, thereby generating a gradient magnetic field at the imaging area having the set object P, and further generating RF signals from the RF coil 24.

Consequently, the RF coil 24 receives MR signals generated due to nuclear magnetic resonance in the object P. Then, the receiver 30 receives the MR signals from the RF coil 24. The receiver 30 generates raw data, which is digital data of the MR signals, by necessary signal processing and subsequent A/D (analog to digital) conversion of the MR signals. The receiver 30 outputs the generated raw data to the sequence controller 31. The sequence controller 31 outputs the raw data to the computer 32.

Then, the data processing unit 41 of the computer 32 arranges the raw data as k-space data in the k-space formed in the k-space data storage part 42. Such an acquisition of k-space data and an arrangement of the k-space data in the k-space are repeatedly performed according to the pulse sequence.

The acquisition of k-space data will be explained along the pulse sequence. First, in step S21, an on-resonance RF pulse is applied to the object P as the excitation pulse to generate MR signals. Moreover, in the case of an FSE sequence or a Hybrid EPI sequence, an on-resonance RF pulse is applied as a refocus pulse. Next, in step S22, the first off-resonance RF pulse is applied as an RF phase encoding pulse to the MR signals.

Thereby, in step S23, MR signals subjected to the phase encoding are sampled by the application of the RO gradient magnetic field pulse. Next, in step S24, the second off-resonance RF pulse is applied as a RF phase rewind pulse after the readout of the MR signals. Thereby, the phase shift, which arose in the magnetic spins due to the first off-resonance RF pulse, is compensated.

Next, in step S25, it is determined in the data processing unit 41 whether all the MR signals required in order to obtain purposed medical information, such as diagnostic images or the B1 distribution, have been acquired. When all the required MR signals have not been acquired, the applications of the RF pulses and the sampling of the MR signals from step S21 to step S24 are repeated. As a result, all the MR signals, which are the targets of data processing for obtaining the medical information, are acquired.

Note that, in the case of a single shot FSE sequence for applying the excitation pulse once or a Hybrid EPI sequence, a refocus pulse is to be applied in step S21. Moreover, in the case of the data acquisition under the segment k-space method, all the MR signals, which are the targets of data processing for obtaining the medical information, are acquired by sequentially acquiring trains of MR signals corresponding to segments formed by dividing the k-space.

When it is determined in step S25 that all the MR signals have been acquired, data processing, such as image reconstruction processing or image analysis processing, based on the MR signals according to the purpose is performed in step S3. That is, the data processing unit 41 obtains the information, such as MR images or the B1 intensity, which is the acquisition target by data processing of the MR signals acquired as the k-space data.

For example, in case of the imaging under the MTC method, MR image data which have a MT contrast are generated. In addition, an intensity ratio between trains of MR signals acquired with changing a condition, such as the B1 intensity, of the first off-resonance RF pulse sometimes calculated as an MT ratio. Alternatively, in case of an imaging by the CEST method, MR image data which has a contrast corresponding to the CEST method are generated. On the other hand, when the measurement of the B1 intensity is the purpose, the phase difference in MR signals, acquired with changing a condition, such as the off-resonance frequency, of the first off-resonance RF pulse, is converted into the B1 intensity.

Furthermore, when MR signals corresponding to a PE amount same as a PE amount of MR signals acquired after the application of the first off-resonance RF pulse have been acquired at least once with a TE different from a TE of MR signals acquired after the application of the first off-resonance RF pulse, without applying an off-resonance RF pulse, as shown in FIG. 9, a B1 intensity distribution and a B0 intensity distribution are obtained based on the MR signals acquired without applying an off-resonance RF pulse and the MR signals acquired after the application of the first off-resonance RF pulse.

Figure 16:
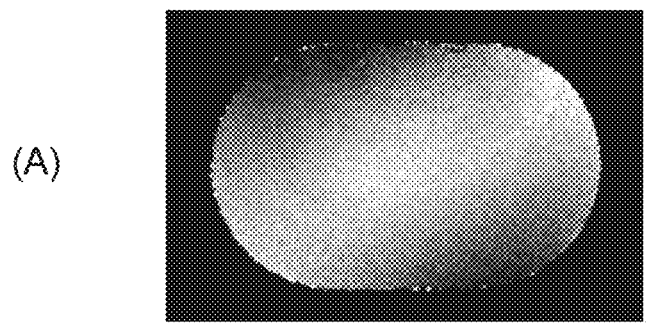
FIG. 16 shows an example of comparing MR images, acquired with the application of the first and second off-resonance RF pulses by the magnetic resonance imaging apparatus shown in FIG. 1, with the conventional MR images.
Figure 16:
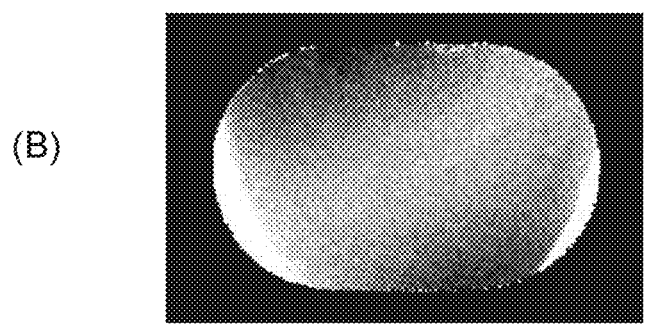
Figure 16:
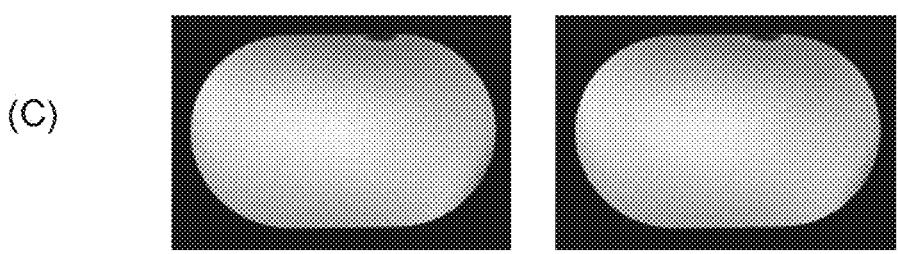
Figure 16:
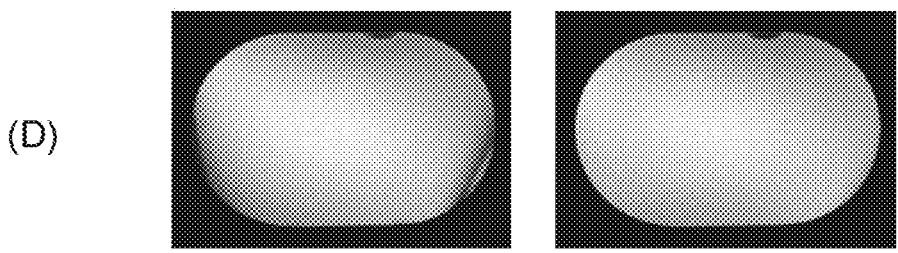

FIG. 16 shows an example of comparing MR images, acquired with the application of the first and second off-resonance RF pulses by the magnetic resonance imaging apparatus 20 shown in FIG. 1, with the conventional MR images.

Each MR image shown in FIG. 16 has been acquired by imaging a phantom enclosing saline and water in which copper sulfate is added, under the static magnetic field of 15 [T], using an SSFP sequence.

FIG. 16 (A) shows a phase difference image having been obtained by changing the off-resonance frequency of the first off-resonance RF pulse into ±df and performing the phase rewind by the application of the second off-resonance RF pulse. That is, the phase difference image shown in FIG. 16 (A) is a subtraction image between a phase image corresponding to the first off-resonance RF pulse whose carrier frequency is f0+df and the phase image corresponding to the first off-resonance RF pulse whose carrier frequency is f0−df.

Meanwhile, FIG. 16 (B) shows a phase difference image having been obtained by changing the off-resonance frequency of the first off-resonance RF pulse into ±df and without performing the phase rewind by the application of the second off-resonance RF pulse.

Each phase difference image shown in FIGS. 16 (A) and (B) has been displayed by indicating the B1 intensities with a gray scale and adjusting the brightness. That is, a pixel, at which the B1 intensity is large, is displayed white more.

On the phase difference image shown in FIG. 16 (B), it can be recognized that the right and left pixels of the phantom have been displayed extremely whitely. That is, unusual B1 intensities have been shown at the right and left of the phantom. On the other hand, on the phase difference image shown in FIG. 16 (A), it can be recognized that the unusual display at the right and left of the phantom has been improved. Moreover, the B1 intensity distribution expected under the static magnetic field of 1.5 [T] has been shown.

Meanwhile, FIG. 16 (C) shows absolute value images of MR signals acquired with the phase encoding by the application of the first off-resonance RF pulse and the phase rewind by the application of the second off-resonance RF pulse. On the other hand, FIG. 16 (D) shows absolute value images of MR signals acquired with the phase encoding by the application of the first off-resonance RF pulse and without the phase rewind by the application of the second off-resonance RF pulse.

On the absolute value images shown in FIG. 16 (D), a banding artifact can be recognized on one image. It is considered that this is because the intensities and the phases of the MR signals have been influenced by the phase shift by the first off-resonance RF pulse which has not been rewound. On the other hand, it can be recognized that the banding artifact has disappeared from the absolute value images shown in FIG. 16 (C).

That is, the above mentioned magnetic resonance imaging apparatus 20 is an apparatus configured to use the applications of the first and the second two off-resonance RF pulses to allow both a phase encoding and a phase rewinding to MR signals within a TR.

Therefore, according to the magnetic resonance imaging apparatus 20, a phase shift in MR signals which arose due to an application of an off-resonance RF pulse can be canceled within a TR. As a result, a data acquisition with an application of an off-resonance RF pulse aiming at an acquisition of MT images, a measurement of the B1 intensity, or the like can be performed using a conventionally difficult pulse sequence, such as an FFE sequence, an SSFP sequence, or an FSE sequence, which repeats a readout with a short TR. In other words, a desired phase shift or saturation effect to MR signals by an off-resonance RF pulse can be obtained without degrading an image quality in a pulse sequence, such as an FFE sequence, an SSFP sequence, or an FSE sequence, for a high speed imaging.

In particular, in an imaging by the conventional MT method, an off-resonance RF pulse is applied as an MT prepulse. On the other hand, according to the magnetic resonance imaging apparatus 20, the MT effect can be obtained without applying a prepulse. Therefore, spare times which arise between data acquisition periods can be reduced to increase the data acquisition efficiency per unit time. In addition, a change in contrast and generating of artifacts resulting from the intermittent data acquisition due to an application of a prepulse can be avoided.

Moreover, even if an off-resonance RF pulse having a relatively small intensity is applied as a saturation pulse, a sufficient improvement effect in contrast can be obtained.

Furthermore, an off-resonance RF pulse can be also added to a data acquisition under the segment k-space method using a pulse sequence for a high speed imaging.

Moreover, information with regard to both a B1 distribution and a B0 distribution can be obtained by adding a TR with the application of the first and second off-resonance RF pulses to a TR with changing a TE without an application of an off-resonance RF pulse.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a data acquiring unit configured to acquire magnetic resonance signals according to an imaging condition for applying a first off-resonance radio frequency pulse after an application of an excitation pulse and before a readout of the magnetic resonance signals, and applying a second off-resonance radio frequency pulse after the readout of the magnetic resonance signals and before an application of a following excitation pulse, the first off-resonance radio frequency pulse generating a phase shift in the magnetic resonance signals, the second off-resonance radio frequency pulse compensating the phase shift; and
a data processing unit configured to obtain information to be obtained by data processing of the magnetic resonance signals.

2. A magnetic resonance imaging apparatus of claim 1, wherein said data acquiring unit is configured to acquire the magnetic resonance signals to be a target of the data processing by sequentially acquiring magnetic resonance signals corresponding to segments obtained by segmenting a k-space.

3. A magnetic resonance imaging apparatus of claim 1, wherein said data acquiring unit is configured to vary intensities of the first off-resonance radio frequency pulse and the second off-resonance radio frequency pulse according to a phase encoding amount.

4. A magnetic resonance imaging apparatus of claim 1, wherein said data acquiring unit is configured to vary at least one of off-resonance frequencies and intensities of the first off-resonance radio frequency pulse and the second off-resonance radio frequency pulse for every repetition time of an acquisition of the magnetic resonance signals.

5. A magnetic resonance imaging apparatus of claim 4, wherein said data acquiring unit is configured to repeatedly apply the first off-resonance radio frequency pulse and the second off-resonance radio frequency pulse of which the off-resonance frequencies have alternately inverted polarities.

6. A magnetic resonance imaging apparatus of claim 5, wherein said data acquiring unit is configured to vary absolute values of the off-resonance frequencies into mutually different values between repetition times.

7. A magnetic resonance imaging apparatus of claim 1, wherein
said data acquiring unit is configured to apply a magnetization transfer pulse as the first off-resonance radio frequency pulse; and
said data processing unit is configured to generate magnetic resonance image data, having a magnetization transfer contrast, as the information to be obtained.

8. A magnetic resonance imaging apparatus of claim 1, wherein
said data acquiring unit is configured to apply a radio frequency pulse, for measuring a radio frequency magnetic field, as the first off-resonance radio frequency pulse; and
said data processing unit is configured to obtain an intensity of the radio frequency magnetic field as the information to be obtained.

9. A magnetic resonance imaging apparatus of claim 1, wherein
said data acquiring unit is configured to apply a radio frequency pulse, for an imaging by a chemical exchange saturation transfer method, as the first off-resonance radio frequency pulse; and
said data processing unit is configured to generate magnetic resonance image data, having a contrast corresponding to the chemical exchange saturation transfer method, as the information to be obtained.

10. A magnetic resonance imaging apparatus of claim 8, wherein
said data acquiring unit is configured to acquire magnetic resonance signals corresponding to a same phase encoding amount, with varying each off-resonance frequency of the first off-resonance radio frequency pulse and the second off-resonance radio frequency pulse, at least twice and to acquire magnetic resonance signals corresponding to the same phase encoding amount or another same phase encoding amount, with varying an echo time, twice without applying the first off-resonance radio frequency pulse and the second off-resonance radio frequency pulse, and
said data processing unit is configured to obtain the intensity of the radio frequency magnetic field and an intensity of a static magnetic field.

11. A magnetic resonance imaging apparatus of claim 8, wherein
said data acquiring unit is configured to acquire magnetic resonance signals corresponding to a phase encoding amount same as a phase encoding amount of magnetic resonance signals acquired after an application of the first off-resonance radio frequency pulse, with an echo time different from an echo time of the magnetic resonance signals acquired after the application of the first off-resonance radio frequency pulse, at least once, without applying an off-resonance radio frequency pulse; and
said data processing unit is configured to obtain an intensity distribution of the radio frequency magnetic field and an intensity distribution of a static magnetic field based on the magnetic resonance signals acquired after the application of the first off-resonance radio frequency pulse and the magnetic resonance signals acquired without applying the off-resonance radio frequency pulse.

12. A magnetic resonance imaging apparatus of claim 8, wherein
said data acquiring unit is configured to repeatedly apply the radio frequency pulse, for measuring the radio frequency magnetic field, with varying a phase encoding amount; and
said data processing unit is configured to obtain the intensity of the radio frequency magnetic field as two dimensional data.

13. A magnetic resonance imaging apparatus of claim 1, wherein said data acquiring unit is configured to apply a first gradient magnetic field pulse simultaneously with the first off-resonance radio frequency pulse and apply a second gradient magnetic field pulse simultaneously with the second off-resonance radio frequency pulse, a polarity of the first gradient magnetic field pulse being opposite to a polarity of the second gradient magnetic field pulse.

14. A magnetic resonance imaging apparatus of claim 7, wherein said data acquiring unit is configured to apply a first gradient magnetic field pulse for a region selection simultaneously with the magnetization transfer pulse and a second gradient magnetic field pulse for a region selection simultaneously with the second off-resonance radio frequency pulse, a polarity of the first gradient magnetic field pulse being opposite to a polarity of the second gradient magnetic field pulse.

15. A magnetic resonance imaging apparatus of claim 1, wherein said data acquiring unit is configured to repeatedly apply the first off-resonance radio frequency pulse and the second off-resonance radio frequency pulse using an electrocardiogram signal as a gating signal, to make an off-resonance frequency of the first off-resonance radio frequency pulse constant during one heart rate, and to change a polarity of the off-resonance frequency of the first off-resonance radio frequency pulse between adjacent heart rates.

16. A magnetic resonance imaging apparatus of claim 1, wherein said data acquiring unit is configured to repeatedly apply the first off-resonance radio frequency pulse and the second off-resonance radio frequency pulse using an electrocardiogram signal as a gating signal, and to repeatedly acquire magnetic resonance signals with alternately inverting polarities of off-resonance frequencies of the first off-resonance radio frequency pulse and the second off-resonance radio frequency pulse.

17. A magnetic resonance imaging apparatus of claim 1, wherein said data acquiring unit is configured to acquire plural magnetic resonance signals between the first off-resonance radio frequency pulse and the second off-resonance radio frequency pulse.

18. A magnetic resonance imaging apparatus comprising:
a data acquiring unit configured to acquire magnetic resonance signals according to an imaging condition for applying a first off-resonance radio frequency pulse, as a magnetization transfer pulse or a radio frequency pulse for measuring a radio frequency magnetic field, after an application of an excitation pulse and before a readout of the magnetic resonance signals, and applying a second off-resonance radio frequency pulse after the readout of the magnetic resonance signals and before an application of a following excitation pulse, the first off-resonance radio frequency pulse generating a phase shift in the magnetic resonance signals, the second off-resonance radio frequency pulse compensating the phase shift; and
a data processing unit configured to obtain magnetic resonance image data, having a magnetization transfer contrast or an intensity of the radio frequency magnetic field by data processing of the magnetic resonance signals.

19. A magnetic resonance imaging (MRI) method comprising:
acquiring magnetic resonance signals with an MRI system according to an imaging condition for applying a first off-resonance radio frequency pulse after an application of an excitation pulse and before a readout of the magnetic resonance signals, and applying a second off-resonance radio frequency pulse after the readout of the magnetic resonance signals and before an application of a following excitation pulse, the first off-resonance radio frequency pulse generating a phase shift in the magnetic resonance signals, the second off-resonance radio frequency pulse compensating the phase shift; and
processing the acquired magnetic resonance signals by reconstructing them into image domain data and providing diagnostic image data to a user.

* * * * *